(12) United States Patent
Ryu

(10) Patent No.: US 8,003,302 B2
(45) Date of Patent: Aug. 23, 2011

(54) METHOD FOR FABRICATING PATTERNS USING A PHOTOMASK

(75) Inventor: Jin Ho Ryu, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 211 days.

(21) Appl. No.: 12/346,303

(22) Filed: Dec. 30, 2008

(65) Prior Publication Data

US 2009/0325082 A1   Dec. 31, 2009

(30) Foreign Application Priority Data

Jun. 26, 2008  (KR) .................. 10-2008-0061041

(51) Int. Cl.
  *G03F 7/20*  (2006.01)
  *G03F 7/36*  (2006.01)
  *G03F 7/40*  (2006.01)
  *G03F 1/08*  (2006.01)
  *G03F 1/14*  (2006.01)

(52) U.S. Cl. ............................. 430/312; 430/5

(58) Field of Classification Search .................. 430/311, 430/312
See application file for complete search history.

(56) References Cited

U.S. PATENT DOCUMENTS

| | | | |
|---|---|---|---|
| 6,428,938 B1 * | 8/2002 | Lin et al. | ............................ 430/5 |
| 6,523,165 B2 | 2/2003 | Liu et al. | |
| 6,730,458 B1 * | 5/2004 | Kim et al. | ..................... 430/311 |
| 7,178,128 B2 | 2/2007 | Liu et al. | |
| 2002/0140920 A1 * | 10/2002 | Rosenbluth et al. | ............. 430/5 |
| 2004/0029021 A1 | 2/2004 | Garza et al. | |
| 2008/0220366 A1 * | 9/2008 | Hatate et al. | ............... 430/270.1 |

FOREIGN PATENT DOCUMENTS

| | | |
|---|---|---|
| KR | 10-1998-077753 | 11/1998 |
| KR | 10-0314743 | 11/2001 |
| KR | 10-2004-0025289 | 3/2004 |
| KR | 10-2007-0086036 | 8/2008 |

\* cited by examiner

*Primary Examiner* — Mark F Huff
*Assistant Examiner* — John Ruggles
(74) *Attorney, Agent, or Firm* — Marshall, Gerstein & Borun LLP

(57) ABSTRACT

Disclosed herein is a method for fabricating a pattern using a photomask that includes forming a first light shielding layer pattern over a substrate; forming a first resist layer pattern aligned to the first light shielding layer pattern over the first light shielding layer pattern; forming a phase shift region by selectively etching a portion of the substrate exposed by the first light shielding layer pattern; forming a second resist layer pattern by reducing the line width of the first resist layer pattern; forming a second light shielding layer pattern, having a reduced line width, by etching an exposed portion of the first light shielding layer pattern, and exposing a portion of the substrate adjacent the groove to form a rim region; removing the second resist layer pattern to form a photomask; and transferring a second pattern onto a wafer by performing an exposure process using the photomask.

9 Claims, 8 Drawing Sheets

METHOD FOR FABRICATING PATTERNS USING A PHOTOMASK

CROSS-REFERENCE TO RELATED APPLICATIONS

Priority to Korean patent application no. 10-2008-0061041, filed on Jun. 26, 2008, the disclosure of which is incorporated herein by reference in its entirety, is claimed.

BACKGROUND OF THE INVENTION

The invention relates to photolithography, and more particularly, to a method for fabricating patterns using a photomask.

A semiconductor device, for example, a Dynamic Random Access Memory (DRAM) device, is made up of numerous fine patterns formed using a lithography process. In the lithography process, a resist layer is coated on a target layer to be patterned, and an exposure process and a development process are performed on the resist layer to form a resist layer pattern, which exposes a portion of the target layer. An etching process using the resist layer pattern as a mask is performed to remove the exposed portion of the target layer, to form the pattern. The resist layer pattern is then removed. As a design rule of the patterns formed on a semiconductor substrate is decreased with an increase in integration degree of the semiconductor device, a Critical Dimension (CD) of the pattern is also decreased. Therefore, a photomask having a fine pattern is required to form a highly integrated circuit using a lithography process. A binary mask has been used as the photomask. The binary mask includes a light shielding layer pattern formed on a transparent substrate. Transmitted light can be made incident on a wafer after passing through the substrate alone. In order to fabricate finer patterns on the wafer, a half-tone phase shift mask using a phase shift material having a transmittance of several percent has also been suggested and employed.

In the application of the lithography technology using this photomask, design data which contains a layout for the pattern is required to fabricate one pattern. Design data is information made with design layout data. For example, another completed design layout data for a hole-type pattern is required to fabricate or modify a CD and a shape of a hole-type pattern. Therefore, if modification or change of the pattern is required, it is necessary to establish new design layout data. Since this additional design takes much time to develop, it can lead to a delay of the development of the photomask. Consequently, increased time and effort are required to obtain the finally completed mask.

SUMMARY OF THE INVENTION

In one embodiment, a method for fabricating a pattern using a photomask comprises: forming a primary photomask by forming a first light shielding pattern having a first pattern over a substrate, wherein the first pattern has an island pattern layout; transferring a corresponding first pattern onto a first region of a wafer by performing a first exposure process using the primary photomask; forming a first resist pattern aligned over the first light shielding pattern of the primary photomask; forming a phase shift region having a groove by selectively etching the exposed portion of the substrate using the first resist pattern and the first light shielding pattern as an etching mask; forming a second resist pattern that exposes a portion of the first light shielding pattern by reducing a line width of the first resist pattern; forming a second light shielding pattern having a reduced line width from the first light shielding pattern by etching an exposed portion of the first light shielding pattern using the second resist pattern as an etching mask, wherein a portion of the substrate adjacent to the groove forms a rim region; removing the second resist pattern to form a secondary photomask having a second pattern, the second pattern comprising a light shielding region defined by the second light shielding pattern, the phase shift region, and the rim region; and transferring a corresponding second pattern onto a second region of the wafer by performing a second exposure process on the wafer using the secondary photomask.

Preferably, the first pattern layout is an island pattern layout designed as a layout for defining an active region over the wafer.

Preferably, the island pattern layout is designed as a layout in which cross shapes each having a major axis and a minor axis of different lengths are repeatedly arranged for the active region. The second pattern is preferably a hole-shaped pattern when the first pattern layout is an island pattern layout.

Preferably, the first resist layer pattern is formed by coating a resist layer to cover the first light shielding layer pattern; selectively exposing a portion of the resist layer being disposed between adjacent elements of the first light shielding layer pattern by irradiating a backside exposure light from a backside of the substrate; and developing and removing the exposed portion of the resist layer.

Preferably, the second resist layer pattern is formed by irradiating UV light onto the first resist layer pattern.

Preferably, the UV light is irradiated on the first resist layer in an atmosphere including nitrogen ($N_2$) gas and oxygen ($O_2$) gas.

Preferably, a width of the second light shielding layer pattern is varied depending on a length of time that the first resist layer pattern is irradiated with the UV light.

In another embodiment, a method for fabricating a pattern using a photomask includes obtaining design data of a first pattern layout; forming a primary photomask by forming a first light shielding layer pattern having the first pattern layout over a first substrate; transferring the first pattern layout onto the wafer by performing a first exposure process using the primary photomask; forming a second light shielding layer pattern having the first pattern layout over a second substrate, wherein a portion of the substrate is exposed between adjacent elements of the second light shielding layer pattern; forming a first resist layer pattern aligned to the second light shielding layer pattern over the second light shielding layer pattern; forming a phase shift region having a groove by selectively etching the exposed portion of the second substrate using the first resist layer pattern as an etching mask; forming a second resist layer pattern that exposes a portion of the second light shielding layer pattern by reducing the line width of the first resist layer pattern; forming a third light shielding layer pattern, having a reduced line width by etching an exposed portion of the second light shielding layer pattern using the second resist layer pattern as an etching mask, wherein a portion of the second substrate adjacent the groove is exposed to form a rim region; removing the second resist layer pattern to form a secondary photomask including a light shielding region defined by the third light shielding layer pattern, the phase shift region, and the rim region; and transferring a second pattern layout onto a wafer by performing a second exposure process on the wafer using the secondary photomask.

Preferably, the first pattern layout is an island pattern for an isolation region which defines an active region over the wafer.

Preferably, the second pattern layout is a hole pattern. More preferably, the hole pattern is transferred overlappingly onto an active region of the wafer.

DESCRIPTION OF SPECIFIC EMBODIMENTS

Figure 11:
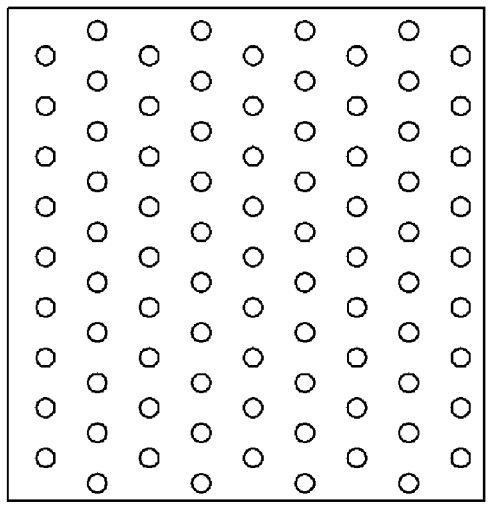
Figure 12:
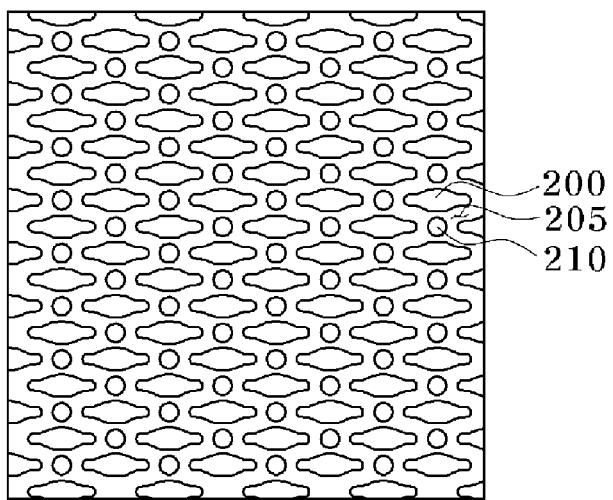
Figure 13A:
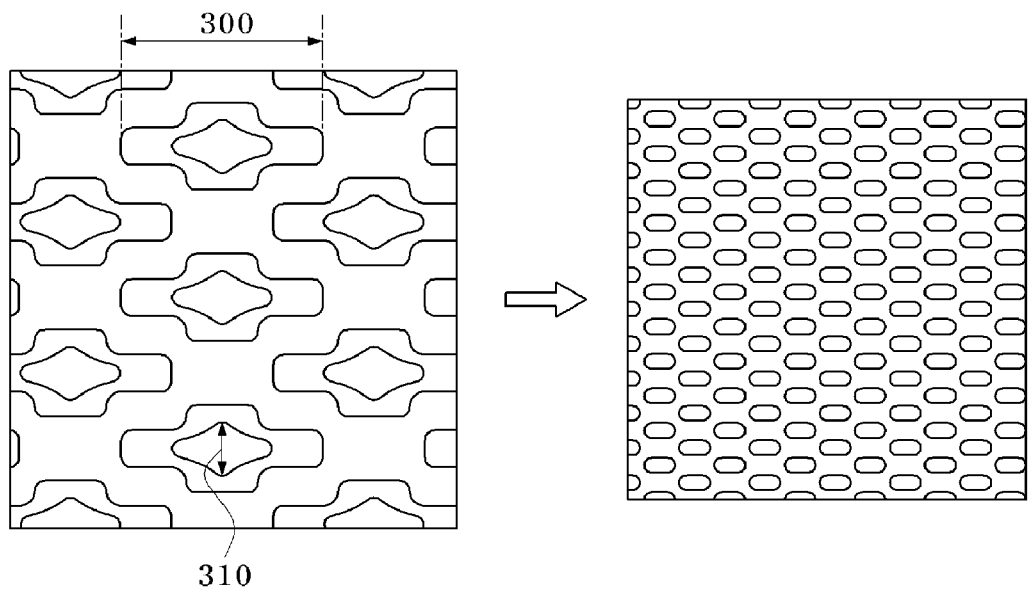
FIGS. 13a and 13b illustrate variation in the profile of the hole-type patterns according to a condition of an island pattern.
Figure 13B:
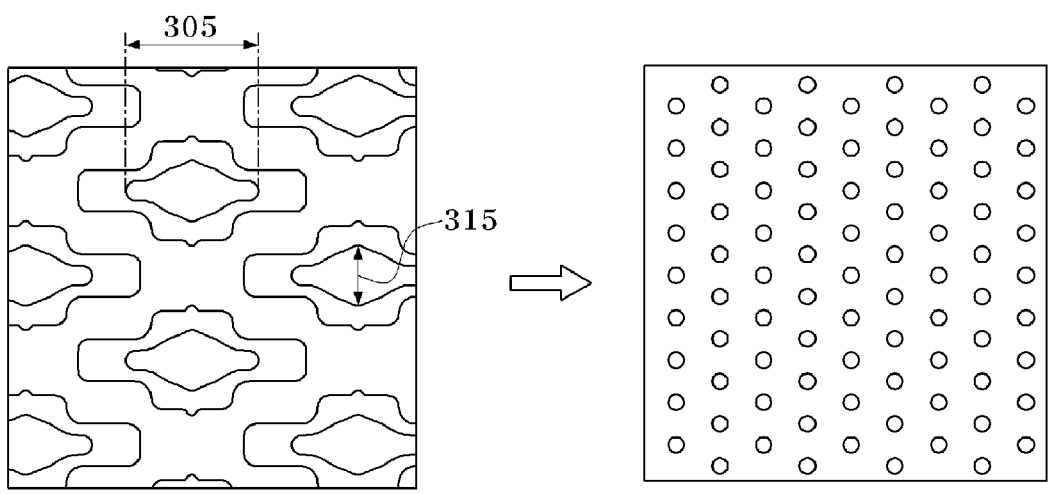
Figure 14:
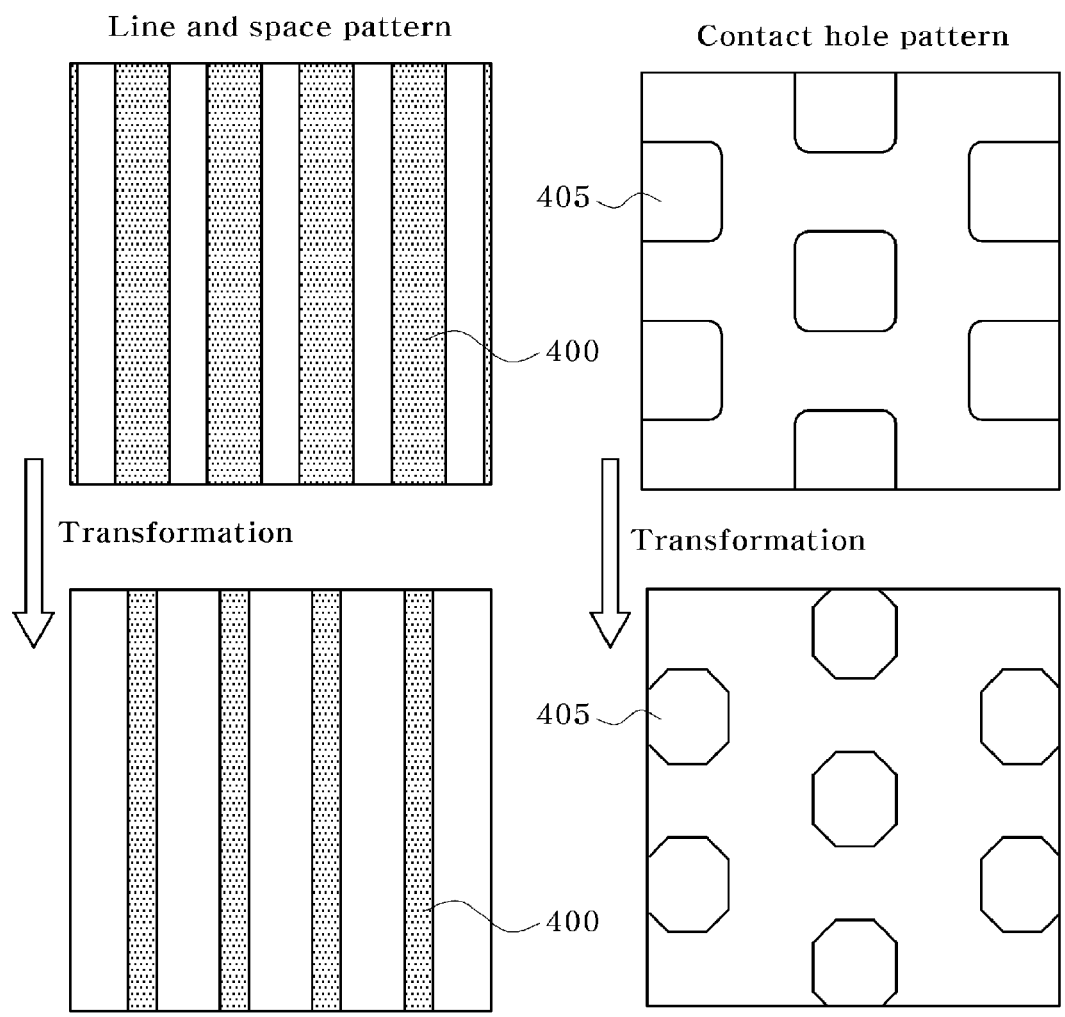
FIG. 14 illustrates profile variation when the rim-type photomask is applied to various patterns.

FIGS. 1 to 12 illustrate a method for fabricating a hole-type pattern using a rim-type photomask according to an embodiment of the invention. FIGS. 13a and 13b illustrate variations in the profile of the hole pattern according to a condition of an island pattern. FIG. 14 illustrates profile variation when the rim-type photomask is applied to various patterns.

Figure 1:
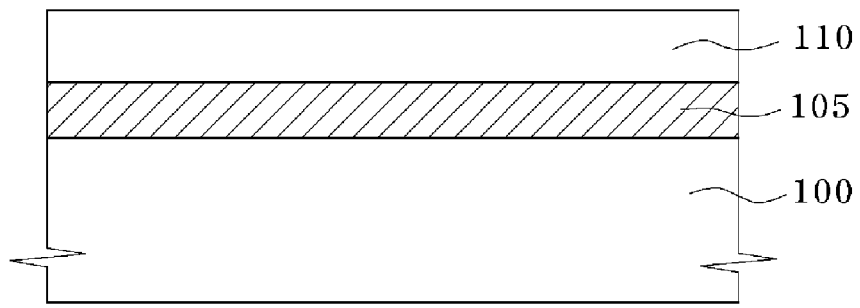
FIGS. 1 to 12 illustrate a method for fabricating hole-type patterns using a rim-type photomask according to an embodiment of the invention.

Referring to FIG. 1, a light shielding layer 105 and a first resist layer 110 are sequentially deposited over a substrate 100 to fabricate a blank mask. The substrate 100 can be made, for example, of a light transmittable transparent material including quartz. The light shielding layer 105 formed over the substrate 100 shields light transmitted through the substrate 100 during a subsequently performed exposure process. This light shielding layer 105 can be formed, for example, of a chrome (Cr) layer. While it is possible to employ a half-tone phase shift mask having a phase shift material as the blank mask, it is preferable to employ the binary blank mask since a binary mask having a light shielding layer 105 can have superior printability as compared the half-tone phase shift mask when the pattern size becomes finer.

Figure 2:
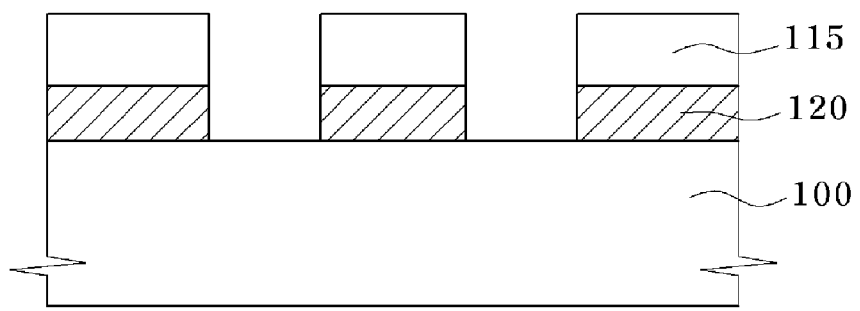
Figure 3:
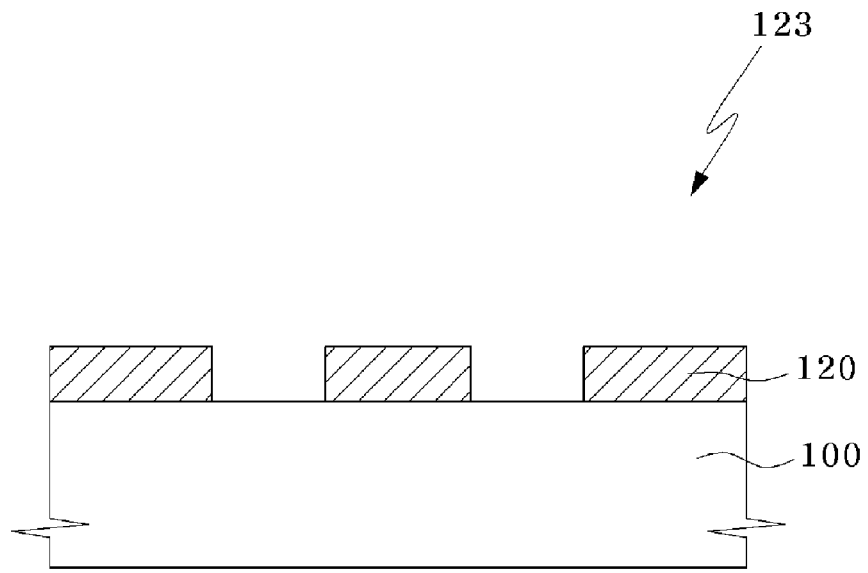

Referring to FIGS. 2 and 3, a first patterning process is performed on the binary blank mask to form a light shielding layer pattern 120 that selectively exposes a portion of the substrate 100 (refer to FIG. 2). Specifically, a lithography process including an exposure process and a development process can be performed on the first resist layer 110 to form a first resist layer pattern 115 that exposes a portion of the light shielding layer 105. This first patterning process can be performed using, for example, an island pattern design layout. The design data of an island pattern can be designed as a pattern layout data for defining an active region in which cell transistors of a memory device such as a DRAM device are integrated. In the designed layout, like a layout of an island pattern 200 shown in FIG. 12, Shallow Trench Isolation (STI) can be used as an isolation region for defining the active region. The island pattern 200 can be designed, for example, for defining the active region so as to have a rectangular-shaped layout or a cross-shaped layout of which a major axis 300, 305 and a minor axis 310, 315 have different lengths (see FIG. 13B, for example). The exposure process can be performed, for example, using an electron beam apparatus. The first resist layer pattern 115 can then be removed by performing, for example, a strip process. As shown in FIG. 3, as a result a primary mask 123 having the light shielding layer pattern 120 that selectively exposes the substrate 100 is formed. In the embodiment shown in FIG. 3, the light shielding layer pattern 120 is formed in an island structure. The primary mask 123 can be used, for example, in a process of forming the STI that defines the active region of the cell. Specifically, the primary mask 123 can be used in an exposure process for patterning a photoresist pattern that covers the active region of the semiconductor substrate and exposes the isolation region.

Figure 4:
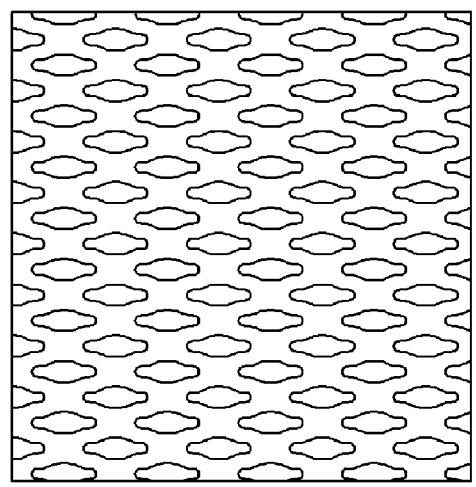

Referring to FIG. 4, with respect to the primary mask 123 formed using the design data of the island pattern, printability to a wafer can be confirmed by measuring the pattern image realized through a simulation. It can be appreciated that the pattern to be transferred onto the wafer through the primary mask 123 has the shape of an island pattern. This island pattern can be employed when forming an isolation layer pattern in a semiconductor device. The island pattern can be transformed, for example, into a hole-type pattern using the design data of the same island pattern together with the primary mask 123 having the shape of the island pattern.

Figure 5:
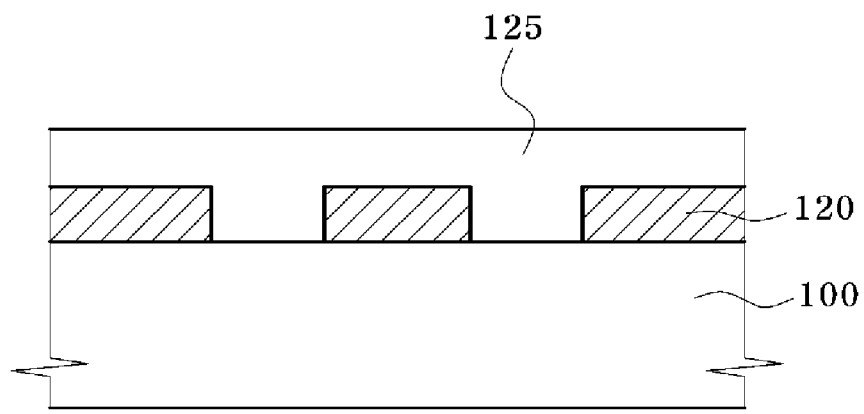

Referring to FIG. 5, a second resist layer 125 is formed over the substrate 100. The second resist layer 125 is formed to a thickness sufficient to bury the light shielding layer pattern 120. For example, the second resist layer 125 can be formed to a thickness in a range of 4000 to 8000 Å. The second resist layer 125 can be formed, for example, of a positive-type photoresist material. A portion of the positive-type photoresist matter can be irradiated by light in an exposure process and removed in a development process.

Figure 6:
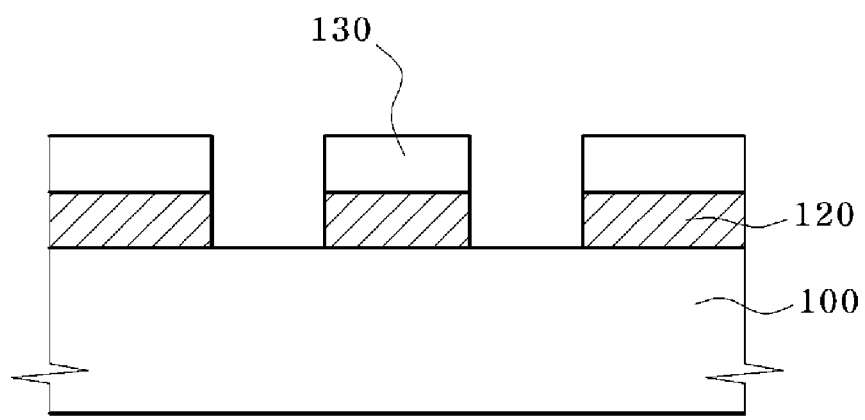

Referring to FIG. 6, a lithography process can be performed, for example, on the second resist layer 125 to form a second resist layer pattern 130 that exposes a portion of the substrate 100 and covers an upper surface of the light shielding layer pattern 120. The substrate 100 is exposed between adjacent elements of the second resist layer pattern 130. Specifically, a backside exposure can be performed from the backside of the substrate 100 toward the second resist layer 125. By performing this backside exposure, some of the light irradiated through the substrate 100 is shielded by the light shielding layer pattern 120 and the rest of the light is transmitted through the space between adjacent light shielding layer pattern 120 elements to irradiate to the second resist layer 125. Then, physical properties of the portion of the second resist layer 125 irradiated by the light are changed. The backside exposure can be performed, for example, by using an Ix aligner or an Ultra Violet (UV) unit. Next, a development process can be performed on the second resist layer 125 onto which the backside exposure is performed to form a second resist layer pattern 130. Specifically, by performing the development process on the second resist layer 125 using a developing solution, the portion of the second resist layer 125 on the light shielding layer pattern 120 remains, and the portion of the second resist layer 125 irradiated by the light transmitted through the substrate 100 is removed. This can result, for example, from the properties of the positive-type photoresist in which the portion irradiated by the light is removed, thereby fabricating a second resist layer pattern 130 that exposes a portion of the substrate 100 between adjacent elements of the light shielding layer pattern 120.

Figure 7:
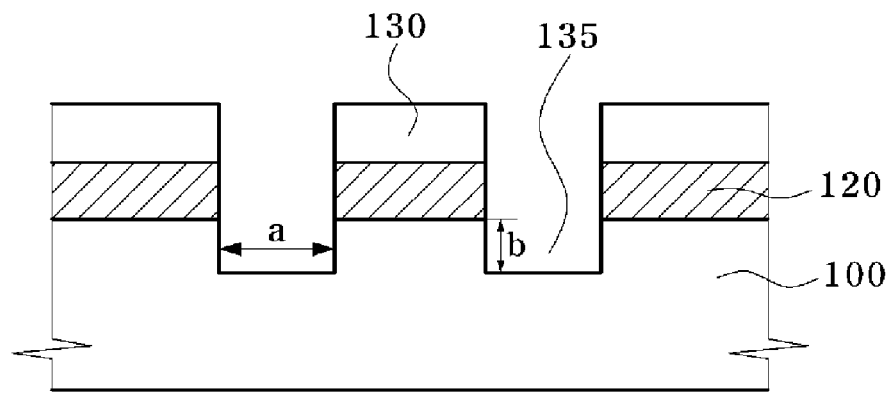

Referring to FIG. 7, the exposed portion of the substrate 100 is etched using the second resist layer pattern 130 as an etching mask to form a groove 135 having a predetermined depth. The etching of the substrate 100 can be performed without damaging the light shielding layer pattern 120, for example, by using a dry etching process employing, for example, chloride (Cl) gas. To obtain a phase shift effect generated by the depth of the groove 135 formed within the substrate 100 in a subsequently performed exposure process, the groove 135 is formed to substantially same depth as the wave length of the light used in the exposure process. For example, when an exposure apparatus which employs a light source having a wavelength of 193 nm wave length is used, the groove 135 can be formed to a depth of 193 nm, which is the same as the wave length of the light. By forming the groove 135 to the same depth as the wave length of the light used in the exposure process, it is possible to increase the fidelity of the pattern by creating a phase shift between the surface of the substrate 100 and the bottom of the groove 135. Preferably the groove 135 has a width not exceeding about 770 nm, and a depth b not exceeding about 200 nm.

Figure 8:
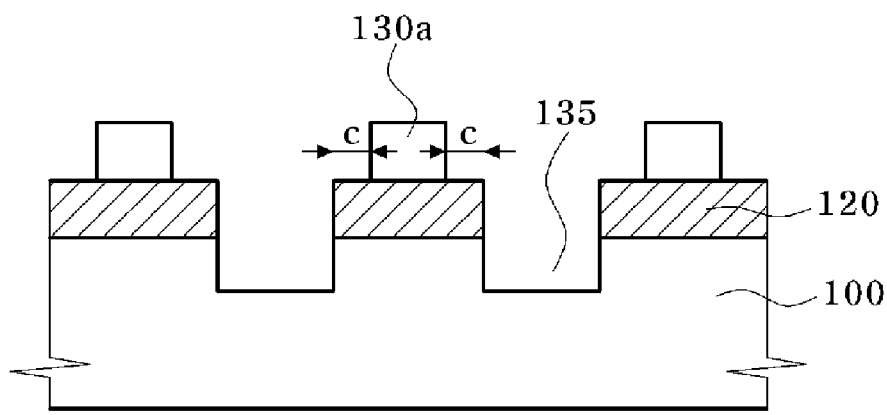

Referring to FIG. 8, UV light, for example, can be irradiated onto the second resist layer pattern 130 to form a shrunken second resist layer pattern 130a having a line width decreased by a predetermined width 2c. Preferably, UV light with an about 172 nm wave length is irradiated onto the second resist layer pattern 130 while supplying, for example, nitrogen ($N_2$) gas and oxygen ($O_2$) gas at a flow rate ratio, for example, of about 1:5 onto the second resist layer pattern 130. The exposure energy of the UV light irradiated with an about 172 nm wave length and ozone generated under an oxygen atmosphere can result in the chemical pulverization or degeneration of the resist material, thereby shrinking the line width of second resist layer 130. The line width of second resist layer pattern 130 can be decreased, for example, at a shrink rate of about 2.5 nm/min. The shrink rate of the second resist layer pattern 130 can be controlled by the time in which the second resist layer pattern 130 is exposed to the UV light. For example, the second resist layer pattern 130 can be exposed to the UV light for at least about 40 minutes. The shrunken second resist layer pattern 130a having a decreased line width exposes a portion of the light shielding layer pattern 120.

Figure 9:
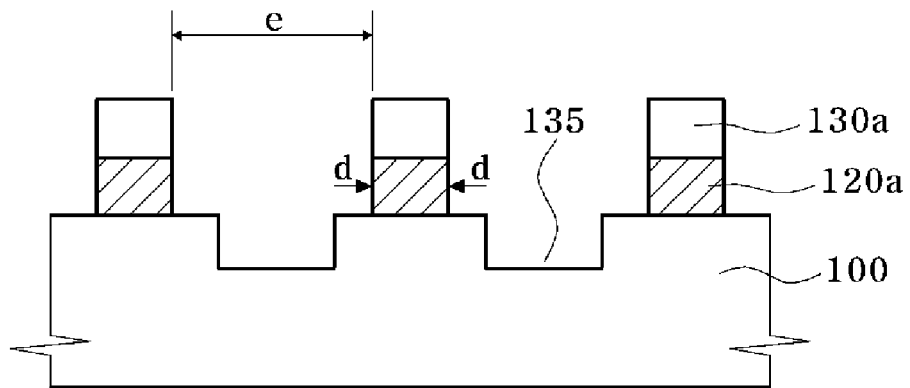

Referring to FIG. 9, the exposed portion of the light shielding layer pattern 120, (refer to FIG. 8) is additionally etched using the shrunken second resist layer pattern 130a as an etching mask to form a shrunken light shielding layer pattern 120a. Accordingly, a portion of the substrate 100 is further exposed by the additionally etched widths d, and has a height difference corresponding to the depth b, (refer to FIG. 7) of the groove 135 formed within the substrate 100. The additional etching of the light shielding layer pattern 120 can be performed, for example, in a dry etching process. Since the shrunken second resist layer pattern 130a is used as an etching mask when etching the light shielding layer pattern 120, it is possible to control the final CD of the shrunken light shielding layer pattern 120a by controlling the shrink rate and the extent of shrinking of the second resist layer pattern 130. It can be important to appropriately control the shrink rate and the extent of shrinking of the second resist layer pattern 130 since the CD and the profile of the shrunken light shielding layer pattern 120a can be an important factor that determines exposure energy transferred by the light shielding effect. Preferably, the width d of the substrate 100 exposed by the shrunken light shielding layer pattern 120a does not exceed about 80 nm and a distance e between adjacent elements of the shrunken light shielding layer pattern 120a does not exceed about 930 nm.

Figure 10:
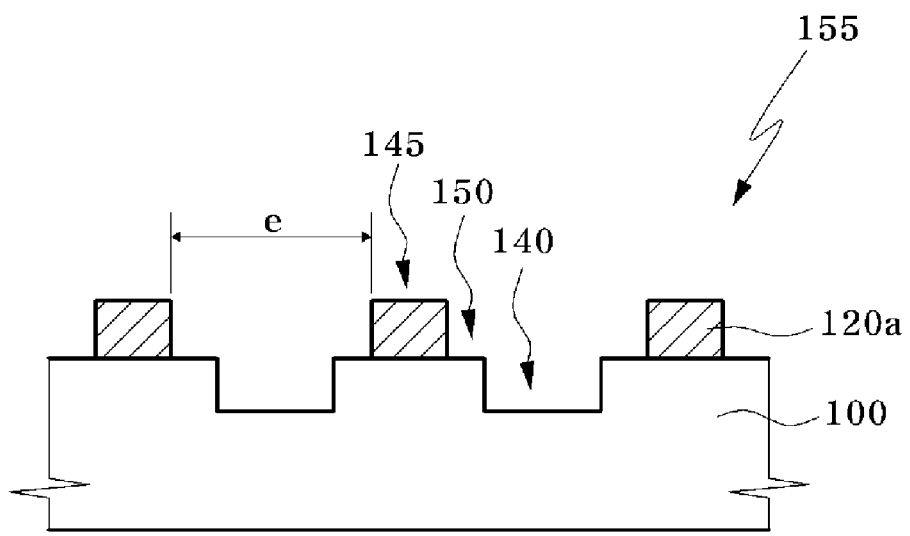

Referring to FIG. 10, the shrunken second resist layer pattern 130a is removed, thus forming a second mask 155 over the substrate 100, which is provided with a phase shift region 140 defined by the groove 135 formed within the substrate 100, a light shielding region 145 defined by the shrunken light shielding layer pattern 120a, and a rim region 150 defined between the phase shift region 140 and the light shielding region 145. The distance between adjacent elements of the shrunken light shielding layer pattern 120a does not exceed about 930 nm. The rim region 150 is a high transmission region, which transmits more light during the process of transferring the pattern onto the wafer.

Referring to FIG. 11, with respect to the secondary mask 155 formed using the design data of the same island pattern as used for the primary mask 123, printability to the wafer can be confirmed by measuring the pattern image realized through a simulation. It can be appreciated that the pattern to be transferred onto the wafer has a shape of a hole-type pattern. With reference to FIGS. 4 and 11 which show, respectively, the primary mask 123 and the secondary mask 155 formed using the design data of the same island pattern, it can be confirmed that the island pattern and the hole-type pattern are shown respectively even though the exposure is performed under the same exposure condition. For example, the exposure condition for realizing the island pattern and the hole-type pattern in FIGS. 4 and 11 can be substantially the same, including: an aperture number of a lens, for example, of about 0.85, sigma position value, for example, of about 0.82, an exposure amount of the sigma, for example, of about 76%, a dipole illuminating system can be used and threshold voltage value of aerial image, for example, of about 0.255. When the threshold voltage value of the pattern image realized by the simulation is less than about 0.255, it may not be possible to transform the pattern, and the pattern fidelity can also be irregular.

By controlling the depth b, (refer to FIG. 7) of the groove 135 formed in the substrate 100 and controlling the line width of the shrunken light shielding layer pattern 120a with the shrunken second resist layer pattern 130a, it is possible to control the transferred exposure energy and thus transform the island pattern into the hole-type pattern using the design data of the same island pattern. The transformation of the island pattern into the hole-type pattern can be performed in each space 205 in the island pattern 200, as shown in FIG. 12. In other words, in the portion formed with the shrunken light shielding layer pattern 120a (refer to FIG. 10), the light is shielded. In the portion of the respective space 205 of the island pattern 200, the island pattern is transformed into the hole pattern 210 by the substrate 100, the phase shift region 140, and the rim region 150. This hole-type pattern can be employed, for example, when forming a bit line contact for connecting a transistor to a bit line in a semiconductor device.

Meanwhile, it is possible to control the printability by performing, for example, an Optical Proximity Correction (OPC), while controlling the major axis 300, 305 or minor axis 310, 315 of the island pattern. This is because it is possible to control the transfer amount of the exposure energy from the mask to the wafer. Referring to FIGS. 13a and 13b, it can be appreciated that by controlling the pattern feature of the island pattern, e.g. the major axis 300, 305 or minor axis 310, 315 of the pattern, hole patterns of different profiles can be formed even though the pattern is formed by the same design data. The most preferred result can be obtained in the island pattern. Referring to FIG. 14, when introducing the phase shift mask patterning according to the invention, line and space patterns are transformed into reduced width line patterns 400, and square-shaped contact hole patterns are transformed into octagon-shaped patterns. Also, it is possible to control the printability by varying the exposure condition, e.g. an illuminating system and exposure energy, even when using the same photomask.

As is apparent from the above description, in a method for fabricating the hole-type pattern using a photomask according to the invention, it is possible to form hole patterns of various forms using a design data of an existing island pattern without separate design change. Also, it is possible to fabricate a variable mask, which can be used to form various hole patterns. In addition, it is possible to improve the problem of irregular registration since the fabrication process begins from the same design data.

The above embodiments of the invention are illustrative and not limitative. Throughout the specification, where methods and compositions are described as including steps or materials, it is contemplated that the methods and compositions can also consist essentially of, or consist of, any combination of the recited steps or materials, unless described otherwise. While the invention has been described with respect to the specific embodiments, it will be apparent to those skilled in the art that various changes and modifications may be made without departing from the spirit and scope of the invention as defined in the following claims.

What is claimed is:

1. A method for fabricating a pattern using a photomask, the method comprising:
   forming a primary photomask by forming a first light shielding pattern having a first pattern over a substrate, wherein the first pattern has an island pattern layout;
   transferring a corresponding first pattern onto a first region of a wafer by performing a first exposure process using the primary photomask;
   forming a first resist pattern aligned over the first light shielding pattern of the primary photomask;
   forming a phase shift region having a groove by selectively etching the exposed portion of the substrate using the first resist pattern and the first light shielding pattern as an etching mask;
   forming a second resist pattern that exposes a portion of the first light shielding pattern by reducing a line width of the first resist pattern;
   forming a second light shielding pattern having a reduced line width with respect to the first light shielding pattern by etching an exposed portion of the first light shielding pattern using the second resist pattern as an etching mask, wherein a portion of the substrate adjacent to the groove is exposed to form a rim region;
   removing the second resist pattern to form a secondary photomask having a second pattern, the second pattern comprising a light shielding region defined by the second light shielding pattern, the phase shift region, and the rim region; and
   transferring a corresponding second pattern onto a second region of the wafer by performing a second exposure process using the secondary photomask.

2. The method of claim 1, wherein the first light shielding pattern having the island pattern layout is designed for defining an active region over the wafer, and wherein the second light shielding pattern has an island pattern layout designed for defining a contact hole region over the wafer.

3. The method of claim 2, comprising forming the first light shielding pattern having the island pattern layout designed in which cross shapes each having a major axis and a minor axis of different lengths are repeatedly arranged for the active region.

4. The method of claim 2, comprising transferring the corresponding first pattern onto the first region of the wafer as a rectangular-shaped pattern, and transferring the corresponding second pattern onto the second region of the wafer as a hole-shaped pattern.

5. The method of claim 1, comprising forming the first resist pattern by:
   coating a resist layer to cover the first light shielding pattern;
   selectively exposing a portion of the resist layer, the portion being disposed between adjacent elements of the first light shielding pattern by irradiating an exposure light from a backside of the substrate; and
   developing and removing the exposed portion of the resist layer.

6. The method of claim 1, comprising forming the second resist pattern by irradiating UV light onto the first resist pattern.

7. The method of claim 6, comprising irradiating the first resist pattern with the UV light in an atmosphere comprising nitrogen ($N_2$) gas and oxygen ($O_2$) gas.

8. The method of claim 6, comprising controlling the line width of the second light shielding pattern by varying a length of time that the first resist pattern is irradiated with the UV light, and controlling a line width of the second pattern by varying a size of the line width of the second light shielding pattern.

9. The method of claim 2, wherein the first region of the wafer is an active region and the second region of the wafer is a contact region.

* * * * *